US007010453B2

(12) United States Patent
Hildebrant

(10) Patent No.: US 7,010,453 B2
(45) Date of Patent: Mar. 7, 2006

(54) METHODS AND APPARATUS FOR OPTIMIZING LISTS OF WAVEFORMS

(75) Inventor: Andrew Steven Hildebrant, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 41 days.

(21) Appl. No.: 10/685,885

(22) Filed: Oct. 14, 2003

(65) Prior Publication Data

US 2005/0080575 A1  Apr. 14, 2005

(51) Int. Cl.
*G06F 11/263* (2006.01)

(52) U.S. Cl. .................. 702/119; 702/117; 702/66; 714/738

(58) Field of Classification Search .............. 702/119, 702/66, 67, 69–71, 73, 74, 117, 118, 120, 702/124, 126, 179, 184, 198; 714/724, 728, 714/739, 756, 759, 799, 704, 718, 720, 719, 714/42, 738, 781, 794, 796; 324/73.1; 327/105–107; 703/2, 20; 341/120
See application file for complete search history.

(56) References Cited

U.S. PATENT DOCUMENTS

| | | | | |
|---|---|---|---|---|
| 5,052,024 A | | 9/1991 | Moran et al. ................ | 375/219 |
| 5,748,124 A | * | 5/1998 | Rosenthal et al. ........... | 341/120 |
| 5,996,098 A | | 11/1999 | Takano ....................... | 714/727 |
| 6,360,180 B1 | | 3/2002 | Breger ........................ | 702/108 |
| 6,381,728 B1 | * | 4/2002 | Kang .......................... | 714/781 |
| 6,397,173 B1 | * | 5/2002 | Campbell et al. ............. | 703/20 |
| 6,512,989 B1 | | 1/2003 | Deome et al. .............. | 702/124 |
| 6,718,503 B1 | * | 4/2004 | Lerner et al. ................ | 714/755 |
| 6,804,620 B1 | | 10/2004 | Larson et al. ................. | 702/91 |
| 2003/0033099 A1 | | 2/2003 | Sherlock ...................... | 707/66 |
| 2003/0093731 A1 | | 5/2003 | Whannel et al. ............ | 714/726 |
| 2004/0255214 A1 | | 12/2004 | Hildebrant ................... | 714/742 |

OTHER PUBLICATIONS

Andrew Steven Hildebrant, "Systems and Methods for Testing Performance of an Electronic Device", Jun. 12, 2003, U.S. Appl. No. 10/461,252, 13 pages of specification and Seven- (7) sheets of drawings (Figs. 1-7).
Andrew Steven Hildebrant, "Methods and Apparatus for Optimizing the Masking of Waveforms to Reduce the Number of Waveforms in a list of Waveforms", Filed Oct. 14, 2003, New U.S. Patent Application, 21 pages of specification and three- (3) sheets of drawings (Figs. 1-6), U.S. Appl. No. 10/686,376.

* cited by examiner

*Primary Examiner*—Hal Wachsman

(57) ABSTRACT

A list of waveforms is received (the list being one that is to be driven to or received from a pin of a device under test). The list of waveforms is de-interleaved to form lists of non-interleaved waveforms. Each list of non-interleaved waveforms is then optimized by combining at least two of its entries. By way of example, the above method may be implemented by program code stored on a number of computer readable media, or by a circuit tester having program code for implementing same.

23 Claims, 3 Drawing Sheets

METHODS AND APPARATUS FOR OPTIMIZING LISTS OF WAVEFORMS

BACKGROUND OF THE INVENTION

Electronic devices are often tested by generating a plurality of input patterns for the pins of a device under test, applying the input patterns to the device under test, capturing output patterns from the device under test, and then comparing the captured output patterns (or device vectors corresponding thereto) to expected output patterns or vectors.

Each of the afore-mentioned patterns comprises a plurality of sequential states. These states may take a variety of forms, such as logic one (1), logic zero (0), high (H), low (L), or don't care (X).

For some circuit testers, input patterns and expected output patterns are stored in pattern memory as sequences of smaller patterns (e.g., smaller patterns comprising three sequential states of the original pattern); and waveforms corresponding to these smaller patterns are stored in high-speed waveform memories. The patterns stored in the pattern memories are then used to address the waveforms stored in the waveform memories.

Due to the high-speed nature of the waveform memories, these memories are often too small to hold waveforms corresponding to all "potential" patterns stored in pattern memory. Decisions therefore need to be made regarding which waveforms to store in each waveform memory. The United States patent application of Hildebrant entitled "Systems and Methods for Testing Performance of an Electronic Device" (Ser. No. 10/461,252 filed Jun. 12, 2003, hereby incorporated by reference) discloses systems and methods for 1) examining the "actual" patterns that are to be stored in a pattern memory to discern which unique combinations of states are actually found therein, and then 2) using this information as a basis for determining which waveforms should be stored in a corresponding waveform memory.

Sometimes, the frequency at which test data needs to be provided to a device under test (DUT) will exceed the operating frequency of a circuit tester's waveform memories. Some circuit testers therefore have a switching network to associate plural multiplexed waveform memories with a pin of a DUT. Thus, for example, the state-by-state outputs of two waveform memories may be interleaved to provide test data to (or to compare data to an output of) a pin of a DUT, thereby providing the pin or a comparator with test data at twice the rate that one of the waveform memories could provide the test data.

SUMMARY OF THE INVENTION

In one embodiment of the invention, a method comprises receiving a list of waveforms that is to be driven to or received from a pin of a device under test. The list of waveforms is then de-interleaved to form lists of non-interleaved waveforms. Thereafter, each list of non-interleaved waveforms is optimized by combining at least two of its entries.

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
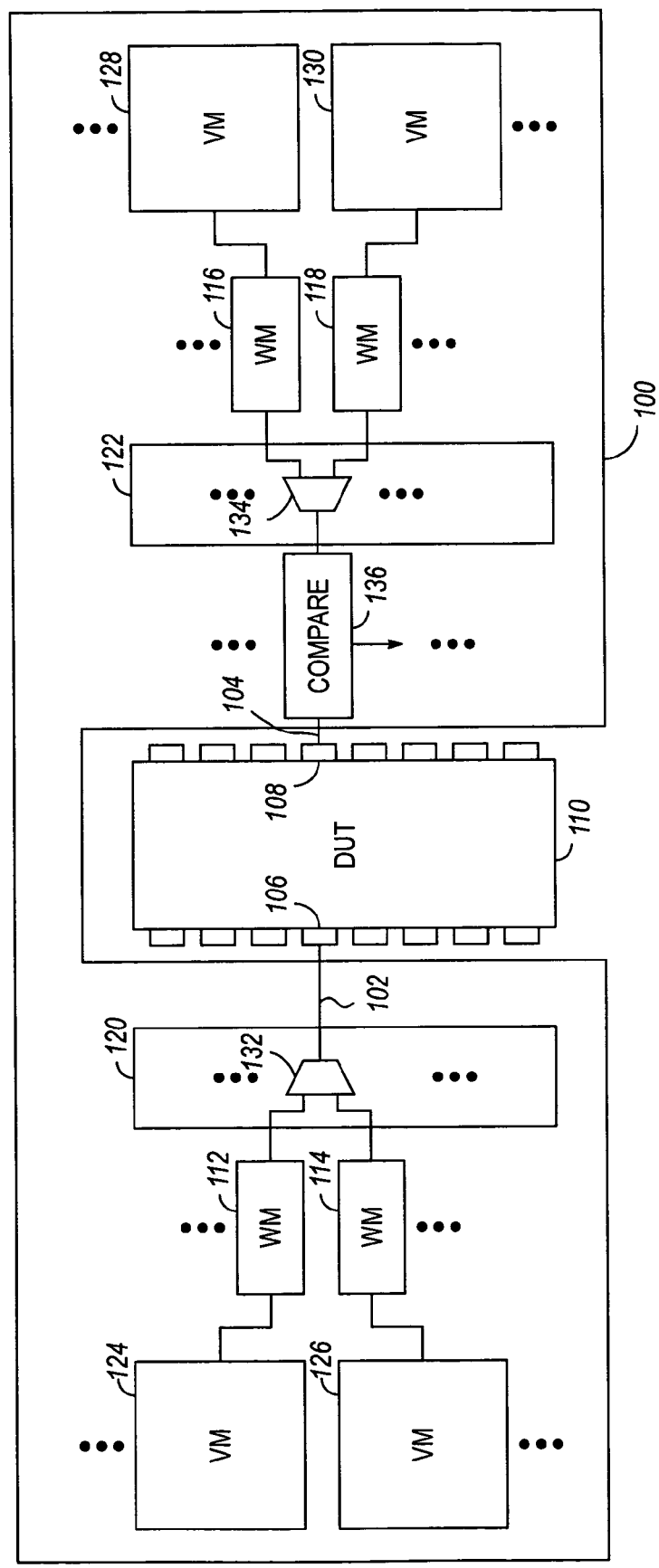
FIG. 1 illustrates an exemplary circuit tester.

FIG. 1 illustrates a circuit tester 100 comprising a plurality of driving probes 102 and receiving probes 104. During circuit test, these probes 102,104 are variously coupled to the input and output pins 106, 108 of a device under test (DUT 110). The circuit tester 100 further comprises a plurality of waveform memories 112, 114, 116, 118, coupled to the plurality of probes 102, 104 via a switching network 120, 122. The circuit tester 100 may also comprise a plurality of pattern memories 124, 126, 128, 130, from which data is read to address the waveform memories 112–118. On the receiving side of the circuit tester 100, circuitry 136 may be provided for comparing expected waveforms for the DUT 110 to actual waveforms received from the DUT 110.

In one configuration of the circuit tester 100, the switching network 120, 122 is used to associate plural multiplexed waveform memories with ones of the probes. For example, two waveform memories 112, 114 are shown to be associated with driving probe 102 via a multiplexer 132; and two waveform memories 116, 118 are shown to be associated with receiving probe 104 via multiplexer 134. In this manner, the state-by-state outputs of two or more waveform memories may be interleaved to provide test data to (or to compare test data to an output of) a pin of a DUT, thereby providing the pin or a comparator with test data at a frequency that is some multiple of that of a single waveform memory.

It should be noted that the particular circuit tester shown in FIG. 1 is exemplary only, and the novel methods and apparatus disclosed herein may be used in conjunction with other testers, some of which may have alternate memory structures, architectures, and/or operational modes.

When evaluating a test pattern (i.e., an input pattern or expected output pattern) for a DUT to derive patterns and waveforms for the memories 112–118, 124–130 of the circuit tester 100, it is customary to evaluate the states of the test pattern sequentially. That is, the states are evaluated from the perspective of the DUT 110. This is because the purpose of test patterns is to test the structure and/or performance of a DUT, and when determining how to compress or otherwise optimize test patterns, they make more sense to a test designer when analyzed in this manner.

Figure 2:
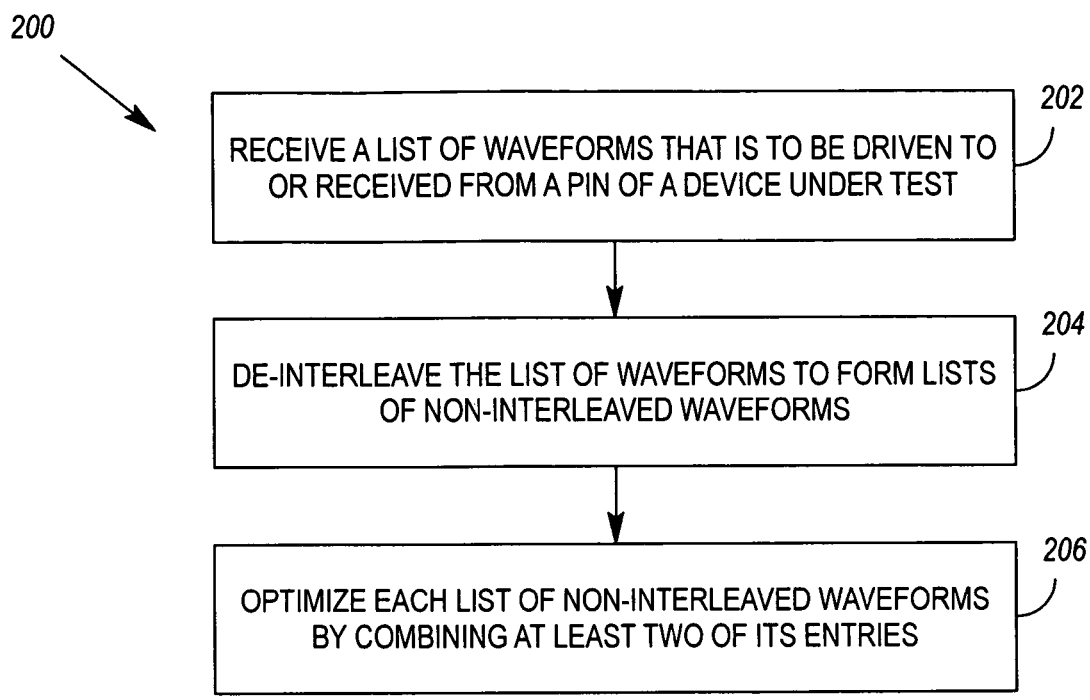
FIG. 2 illustrates an exemplary method for optimizing lists of waveforms.

When patterns and waveforms are to be stored in a circuit tester as shown in FIG. 1, and the circuit tester 100 is configured such that multiple waveform memories 112, 114 are relied on to generate the sequential states of waveforms, the sequential states of the waveforms need to be de-interleaved prior to being stored in the tester's waveform memories 112, 114. Thus, for example, the first and third bits of a 4-bit waveform would need to be extracted as a 2-bit waveform to be stored in a first waveform memory 112, and the second and fourth bits of the 4-bit waveform would need to be extracted as a 2-bit waveform to be stored in a second waveform memory 114. In the past, test designers have been shielded from this extraction/de-interleaving process. Consider, however, two waveform memories capable of storing 32 waveforms each. When their outputs are interleaved, the two memories are capable of generating 1024 distinct waveforms. However, and as will be demonstrated below, if the number of waveforms derived from a test pattern is greater than 1024, and a test designer distills a list of waveforms down to fewer than 1024 waveforms, de-interleaving the list will result in 1024 entries (and not 32). Even if redundant entries in the de-interleaved lists are combined, it is still very likely that the lists will each comprise more than 32 unique waveforms. Furthermore, if the number of waveforms derived from a test pattern is greater than 1024, and a test designer needs to mask one or more waveforms on to other waveforms, it is quite possible that doing so will eliminate test sample points that could otherwise have been maintained if the test designer had first derived de-interleaved lists, and then merged duplicate waveforms in the de-interleaved lists. FIG. 2 therefore illustrates a method 200 for mitigating some or all of these problems.

The method 200 shown in FIG. 2 begins with the receipt 202 of a list of waveforms that is to be driven to or received from a pin of a device under test. The list of waveforms is then de-interleaved 204 to form lists of non-interleaved waveforms. Thereafter, each list of non-interleaved waveforms is optimized 206 by combining at least two of its entries.

Figure 3:
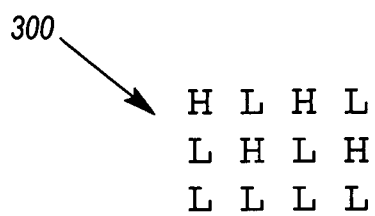
FIGS. 3–5 illustrate a first application of the FIG. 2 method.
Figure 4:
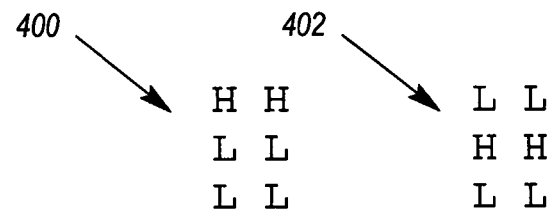

An exemplary list of waveforms 300 is shown in FIG. 3. The list 300 comprises three waveforms: HLHL, LHLH, and LLLL. If these waveforms are to be stored across two waveform memories, two lists of non-interleaved waveforms 400, 402 may be derived from the FIG. 3 waveforms, as shown in FIG. 4.

Figure 5:
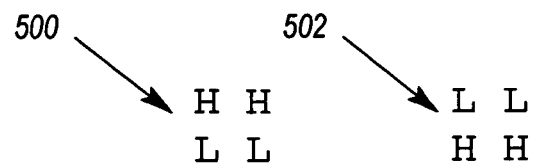

The entries of a list of non-interleaved waveforms may be combined in a number of ways. For example, entries may be combined based on identity of the entries (since it is inefficient to doubly store the same waveform in a single waveform memory). Referring to the lists 400, 402 shown in FIG. 4, one notes that each list contains redundant entries (i.e., LL appears twice in each list). The redundant entries may therefore be combined, and the resultant optimized lists 500, 502 (FIG. 5) may be used to program different waveform memories of a circuit tester. Optionally, the optimized lists 500, 502 may be re-interleaved for presentation to a test designer in a user-friendly format.

At times, a simple combination of identical list entries will not yield lists having fewer entries than a tester's waveform memory size. List entries may therefore need to be optimized in other ways. In other words, a waveform entry of one type may need to be masked by a waveform entry of another type (e.g., the entry HL might be masked by the waveform HX); or two or more entries may need to be masked by a waveform that does not yet appear in their list. Choosing which entries to mask is a difficult task, however, as different maskings typically result in different numbers of test sample points being dropped, and it is typically desirable to make masking choices that preserve a greatest number of test sample points. Also, some maskings of interleaved waveforms yield absolutely no reduction in the number of waveforms appearing in de-interleaved waveform lists. For example, and referring to FIGS. 3 & 4, the masking of waveform LLLL with don't care states (i.e., to waveform XXXX) does not eliminate waveform LL from either of the de-interleaved lists 400, 402 shown in FIG. 4.

The United States patent of Hildebrant entitled "Methods and Apparatus for Optimizing the Masking of Waveforms to Reduce the Number of Waveforms in a List of Waveforms" U.S. Pat. No. 6,944,558, which is hereby incorporated by reference) discloses methods and apparatus for masking Waveform list entries in accordance with weights. For example, the number of times a waveform is encountered in a test pattern may be tracked, and this number may then be assigned to the waveform as its "statistical weight". Or, for example, the importance of a waveform being preserved is determined, and is assigned to the waveform as its "priority weight". A waveform may be deemed to have a greater priority because, for example, it is the only waveform (or one of a few) that may expose a particular fault. The use of weights in combining waveform entries is shown herein in FIGS. 6–9.

Figure 6:
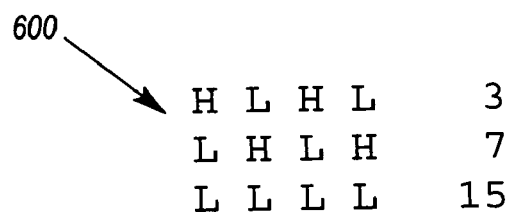
FIGS. 6–9 illustrate a second application of the FIG. 2 method.
Figure 7:
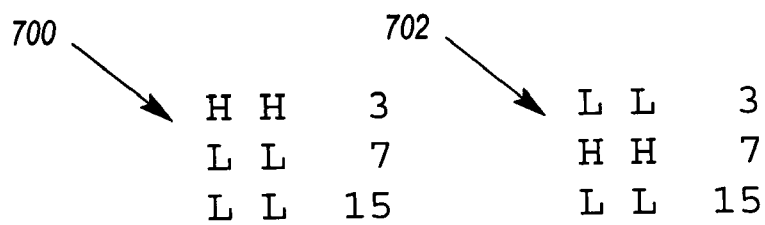

FIG. 6 illustrates the same list of waveforms shown in FIG. 3, but with each entry in the list being associated with a weight. For example, the waveform HLHL has a weight of "3", indicating that it was encountered three times within a given test pattern. When the list 600 shown in FIG. 6 is de-interleaved, the weight associated with each entry in the original list 600 is associated with corresponding entries in each of the resultant non-interleaved lists 700, 702 (FIG. 7). In this manner, the weights may be multiplied by the number of test sample points appearing in their associated waveform, and choices regarding waveform maskings may be made to preserve a greatest number of test sample points (e.g., as described by the United States patent application of Hildebrant entitled "Systems and Methods for Testing Performance of an Electronic Device" (referenced supra)).

Figure 8:
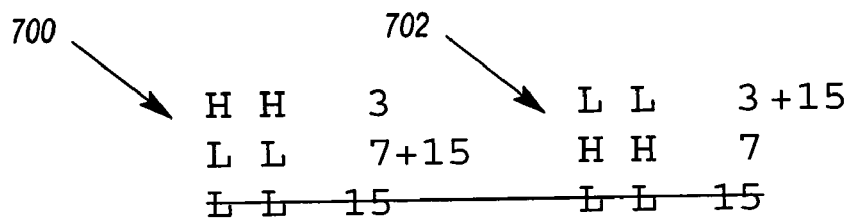
Figure 9:
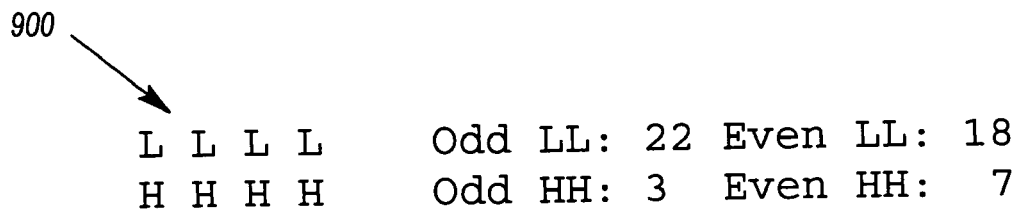

When combining entries in the lists of non-interleaved waveforms 700, 702, the weights associated with combined entries are summed or otherwise combined (see FIG. 8). Following optimization of the lists 700, 702 shown in FIG. 8, the lists may be re-interleaved for presentation to a test designer in a user-friendly format. In one embodiment, prior to re-interleaving the optimized lists 700, 702, the entries of the optimized lists are ordered in accordance with the weights of their entries (and optionally, the weights of the two interleaved lists are displayed with their corresponding interleaved waveforms (see list 900 in FIG. 9)).

In the examples shown in FIGS. 3–9, the same number of entries is maintained in each optimized list. However, this need not be the case, and each list may be optimized to yield a different number of waveform entries. Further, it is not necessary that each and every non-interleaved list be fully or even partially optimized. Thus, if a list of non-interleaved waveforms will fit within a waveform memory without optimization, it need not be optimized. Or, if a list of non-interleaved waveforms will fit within a waveform memory after undergoing only some optimizations, it need not be optimized any further.

The above-described methods may be embodied in program code stored on a number of computer readable media. By way of example, the program code may take any of a variety of forms, including object code, machine code, or code embedded in an EEPROM. Likewise, the computer readable media may take any of a variety of forms, including optical discs, computer memory, a fixed disk, server storage, RAM or ROM. If any of the methods described herein are embodied in program code, the program code may define an interface to receive the list of waveforms that is to be driven to or received from a pin of a device under test. The program code may further comprise an interface to receive an interleave factor (which interface may be integrated with, or distinct from, the interface that receives the list of waveforms). If received, the interleave factor may be used by the program code to determine how many lists need to be de-interleaved from a list of waveforms.

If one or more of the methods described herein is embodied in program code, the program code may be sold or delivered by means of its own computer readable media (e.g., an optical disc), or by integrating the program code with (or installing the program code on) a circuit tester such as that which is shown in FIG. 1.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A computer-implemented method for optimizing a list of interleaved waveforms that are to be driven to or received from a pin of a device under test, comprising:
   receiving the list of interleaved waveforms;
   de-interleaving the list of interleaved waveforms to form lists of non-interleaved waveforms;
   optimizing each list of non-interleaved waveforms for a different one of a plurality of waveform memories, each waveform memory of which is associated with the pin of the device under test, by combining at least two of the list's entries; and
   outputting the waveforms of the optimized lists in a computer-readable form suitable for programming the plurality of waveform memories.

2. The method of claim 1, wherein entries in one of the lists of non-interleaved waveforms are combined based on identity of the entries.

3. The method of claim 1, wherein entries in one of the lists of non-interleaved waveforms are combined by masking an entry of one type with an entry of another type.

4. The method of claim 3, wherein said maskings are chosen to preserve a greatest number of test sample points.

5. The method of claim 1, wherein entries in one of the lists of non-interleaved waveforms are combined by masking two of the list's entries with a waveform not in the list.

6. The method of claim 1, wherein:
   each entry in the list of interleaved waveforms is associated with a weight;
   the weight associated with an entry in the list of interleaved waveforms is associated with a corresponding entry in each of the lists of non-interleaved waveforms; and
   as entries in the lists of non-interleaved waveforms are combined, the weights associated with the combined entries are also combined.

7. The method of claim 6, wherein entries in one of the lists of non-interleaved waveforms are combined to preserve a greatest number of test sample points.

8. The method of claim 6, further comprising, ordering the entries of each optimized list in accordance with the weights of the entries, and then re-interleaving the optimized ordered lists.

9. The method of claim 6, wherein the weights are statistical weights.

10. The method of claim 6, wherein the weights are priority weights.

11. The method of claim 1, further comprising, as each list of non-interleaved waveforms is optimized, maintaining the same number of entries in each optimized list.

12. The method of claim 1, further comprising, re-interleaving the optimized lists, and presenting the re-interleaved list to a user.

13. The method of claim 1, further comprising, combining entries in each list of non-interleaved waveforms, until each list of non-interleaved waveforms comprises fewer entries than a waveform memory size.

14. The method of claim 1, further comprising, using each optimized list to program a different waveform memory of a circuit tester.

15. An apparatus for optimizing a list of interleaved waveforms that are to be driven to or received from a pin of a device under test, comprising:
   a number of computer readable media; and program code, stored on the computer readable media, defining:
      an interface to receive the list of interleaved waveforms;
      program code to de-interleave the list of interleaved waveforms to form lists of non-interleaved waveforms; and
      program code to i) optimize each of the lists of non-interleaved waveforms for a different one of a plurality of waveform memories, each waveform memory of which is associated with the pin of the device under test, by combining at least two of the list's entries, and then ii) output the waveforms of the optimized lists in a computer-readable form suitable for programming the plurality of waveform memories.

16. The apparatus of claim 15, wherein the program code further comprises an interface to receive an interleave factor; the interleave factor being used by the program code to de-interleave the list of interleaved waveforms.

17. The apparatus of claim 15, wherein the program code combines entries in each list of non-interleaved waveforms until each list of non-interleaved waveforms comprises fewer entries than a waveform memory size.

18. The apparatus of claim 15, further comprising program code to re-interleave the optimized lists and present the re-interleaved list to a user.

19. The apparatus of claim 15, further comprising program code to order the entries of each optimized list and re-interleave the optimized ordered lists.

20. A circuit tester, comprising:
   a plurality of driving probes and receiving probes;
   a plurality of waveform memories;
   a switching network to associate plural multiplexed waveform memories with ones of the driving probes and receiving probes;
   an interface to receive lists of interleaved waveforms that are to be driven to and received from the driving probes and receiving probes;
   program code to de-interleave each list of waveforms, thereby forming a set of lists of non-interleaved waveforms for each list of interleaved waveforms;
   program code to optimize each list of non-interleaved waveforms by combining at least two of the list's entries; and
   program code to program the waveform memories corresponding to the optimized lists.

21. The circuit tester of claim 20, wherein the program code further comprises an interface to receive an interleave factor; the interleave factor being used by the program code to de-interleave the list of interleaved waveforms.

22. The circuit tester of claim 20, wherein the program code combines entries in each list of non-interleaved waveforms until each list of non-interleaved waveforms comprises fewer entries than a size of the waveform memories.

23. The circuit tester of claim 20, further comprising program code to re-interleave the optimized lists and present the re-interleaved list to a user.

* * * * *

UNITED STATES PATENT AND TRADEMARK OFFICE
CERTIFICATE OF CORRECTION

PATENT NO. : 7,010,453 B2
APPLICATION NO. : 10/685885
DATED : March 7, 2006
INVENTOR(S) : Hildebrant It is certified that error appears in the above-identified patent and that said Letters Patent is hereby corrected as shown below:

On the face page, in field (56), under "U.S. Patent Documents", in column 2, line 7, after "Sherlock" delete "707/66" and insert -- 702/66 --, therefor.

In column 5, line 62, in Claim 12, after "re-interleaved" delete "list" and insert -- lists --, therefor.

In column 6, line 33, in Claim 18, after "re-interleaved" delete "list" and insert -- lists --, therefor.

In column 6, line 46, in Claim 20, after "list of" insert -- interleaved --.

In column 6, line 57, in Claim 21, delete "list" and insert -- lists --, therefor.

In column 6, line 64, in Claim 23, delete "list" and insert -- lists --, therefor.

Signed and Sealed this

Eleventh Day of July, 2006

JON W. DUDAS
*Director of the United States Patent and Trademark Office*